United States Patent
Gailus et al.

(10) Patent No.: US 9,035,682 B2
(45) Date of Patent: May 19, 2015

(54) METHOD AND APPARATUS FOR SINGLE PORT MODULATION USING A FRACTIONAL-N MODULATOR

(71) Applicant: MOTOROLA SOLUTIONS, INC., Schaumburg, IL (US)

(72) Inventors: Paul H. Gailus, Prospect Heights, IL (US); Joseph A. Charaska, Melrose Park, IL (US); Stephen B. Einbinder, Plantation, FL (US); Robert E. Stengel, Pompano Beach, FL (US)

(73) Assignee: MOTOROLA SOLUTIONS, INC., Schaumburg, IL (US)

( * ) Notice: Subject to any disclaimer, the term of this patent is extended or adjusted under 35 U.S.C. 154(b) by 0 days.

(21) Appl. No.: 13/730,932

(22) Filed: Dec. 29, 2012

(65) Prior Publication Data

US 2014/0184289 A1    Jul. 3, 2014

(51) Int. Cl.
| | |
|---|---|
| *H03L 7/06* | (2006.01) |
| *H03L 7/197* | (2006.01) |
| *H03C 3/09* | (2006.01) |
| *H03L 7/23* | (2006.01) |

(52) U.S. Cl.
CPC ............ *H03L 7/1974* (2013.01); *H03C 3/0925* (2013.01); *H03C 3/0933* (2013.01); *H03L 7/235* (2013.01)

(58) Field of Classification Search
USPC .............. 327/141, 144–163; 331/1/A, 15–17; 375/373–376
See application file for complete search history.

(56) References Cited

U.S. PATENT DOCUMENTS

| | | | |
|---|---|---|---|
| 5,128,633 A | 7/1992 | Martin et al. | |
| 5,166,642 A | 11/1992 | Hietala | |
| 6,414,555 B2 | 7/2002 | Staszewski et al. | |
| 6,873,218 B2 | 3/2005 | Khlat | |
| 7,453,325 B2 | 11/2008 | Hammes et al. | |
| 7,944,376 B2 | 5/2011 | Jensen | |
| 8,054,114 B2* | 11/2011 | Kuo | 327/156 |
| 8,125,277 B1 | 2/2012 | Opsahl | |
| 8,290,113 B2 | 10/2012 | Marienborg | |
| 8,384,452 B1* | 2/2013 | Parker et al. | 327/156 |
| 2003/0119466 A1* | 6/2003 | Goldman | 455/260 |
| 2003/0235261 A1* | 12/2003 | Patana | 375/376 |
| 2006/0170505 A1* | 8/2006 | Humphreys et al. | 331/16 |

(Continued)

FOREIGN PATENT DOCUMENTS

EP    1057252 B1    3/2008

OTHER PUBLICATIONS

Pamarti, S., and Galton, I., "Phase-Noise Cancellation Design Tradeoffs in Delta-Sigma Fractional-N PLLs," IEEE Transactions on Circuits and Systems—II: Analog and Digital Signal Processing, vol. 50, No. 11, Nov. 2003, pp. 829-838.

(Continued)

*Primary Examiner* — Brandon S Cole
(74) *Attorney, Agent, or Firm* — Steven A. May (57) ABSTRACT

A method and apparatus for single port modulation of a phase locked loop frequency modulator includes a phase locked loop with a voltage controlled oscillator (VCO) and a integer loop for multiplying up the output of the VCO which is divided by a fractional-N modulator and divider in the feedback control. The integer loop enables the use of a high frequency reference oscillator that allows a closed loop response of the phase locked loop having a bandwidth that is wider than the modulation bandwidth.

17 Claims, 4 Drawing Sheets (56) References Cited

U.S. PATENT DOCUMENTS

| | | | |
|---|---|---|---|
| 2006/0197613 A1* | 9/2006 | Bunch et al. | 331/16 |
| 2006/0280270 A1 | 12/2006 | Ibrahim et al. | |
| 2007/0085623 A1 | 4/2007 | Staszewski et al. | |
| 2008/0003953 A1 | 1/2008 | Ke et al. | |
| 2008/0129406 A1 | 6/2008 | Nergis | |
| 2009/0190708 A1 | 7/2009 | Grewing et al. | |
| 2010/0207693 A1 | 8/2010 | Fagg | |
| 2011/0175652 A1* | 7/2011 | Kuo | 327/148 |

OTHER PUBLICATIONS

Perrott, M., et al., "A 27-mW CMOS Fractional-N Synthesizer Using Digital Compensation for 2.5-Mb/s GFSK Modulation," IEEE Journal of Solid-State Circuits, vol. 32, No. 12, Dec. 1997, pp. 2048-2060.

"Low Jitter Clock Generator with 6 LVPECL/LVDS/HSTL/13 LVCMOS Outputs," Analog Devices, 2010-2011, 56 pages.

"Low Noise Clock Jitter Cleaner with Dual Loop PLLs," National Semiconductor, LMK04800 Family, Mar. 21, 2011, © National Semiconductor Corporation, Retrived from the internet url: http://data.datasheetlib.com/pdf1/61/61/616155/lmk04803bisqnopb_a8ab55ef24.pdf?take=binary, pp. 1-88.

Miller, B. and Conley, R.J., "A Multiple Modulator Fractional Divider," IEEE Transactions on Instrumentation & Measurement, vol. 40, No. 3, Jun. 1991, pp. 578-583.

PCT International Search Report Dated February 28, 2014 for Counterpart Application PCT/US2013/071923.

* cited by examiner

METHOD AND APPARATUS FOR SINGLE PORT MODULATION USING A FRACTIONAL-N MODULATOR

FIELD OF THE DISCLOSURE

The present disclosure relates generally to radio transceivers and more particularly to radio transceivers using fractional-N modulation in applications where the required modulation bandwidth exceeds an acceptable noise bandwidth that could be achieved using a conventional single port approach.

BACKGROUND

A frequency synthesizer generates a signal at a selected frequency that is within an operational frequency range of the frequency synthesizer, and the selected frequency is derived from the output of a time base or oscillator that typically has a fixed or constant frequency. Frequency synthesizers are found in many modern devices including, but not limited to, radio transceiver apparatuses, mobile telephones, radiotelephones, two-way radio systems, CB radios, satellite receivers, GPS systems, etc. Synthesizers commonly utilize a phase-locked loop (PLL) to produce a desired frequency output from a controlled oscillator at the desired frequency. The frequency of the controlled oscillator is typically controlled by a voltage at a control input, and hence such a controlled oscillator is known as a voltage controlled oscillator (VCO). The output frequency of a PLL synthesizer in the locked condition is determined by the loop divide number. In fractional-N (or so-called FRAC-N) frequency synthesizers the loop divide number can have a fractional portion in addition to an integer portion. FRAC-N frequency synthesizers are particularly valued because of their ability to achieve fine frequency resolution and effectively manage the compromise between lock time and sideband noise. Some FRAC-N synthesizers dynamically switch between different integer loop divide values, one at a time, to produce a sequence of divide values so that on the average an integer plus a fractional divide number is effectively obtained over a period of time. The number of different integer loop divide values available for selection by this dynamic switching action is typically $2^K$, where K is a number of digital accumulators within the synthesizer. For example, a synthesizer having two accumulators utilizes a set of four different integer loop divide numbers; a synthesizer having three accumulators utilizes a set of eight different loop divide numbers; etc. The set of integer divide numbers are typically adjacent integer values, but this is not essential.

One of the concerns in designing a FRAC-N synthesizer is the single sideband noise (SBN) created about the desired output signal. There are several sources of noise that contribute to the output SBN, including noise produced by the phase (or phase frequency) detector and charge pump, SBN produced by the fixed frequency reference, SBN produced by the VCO, noise produced by the divider and noise produced by the FRAC-N process in switching between divide numbers. The noise contributions at the output of the frequency synthesizer from many of these sources are increased by 20 Log($F_{out}/F_{ref}$), where $F_{out}$ is the frequency of the synthesizer and $F_{ref}$ is the frequency of the fixed frequency reference. The frequency synthesizer's loop filter can be designed such that most of the noise sources contributing to the output SBN are reduced at offset frequencies beyond the loop bandwidth of the frequency synthesizer. This is an effective strategy but it constrains the loop bandwidth to less than desirable values when output SBN is an important design consideration. As a result, the loop divide number ($F_{out}/F_{ref}$) becomes a limiting factor. Thus, phase noise considerations dictate using a fixed reference frequency that has a frequency as large as possible while still allowing synthesis of the desired synthesized frequency. Of course, that is countered by considerations such as channel spacing and cost, among others.

In selecting a fixed frequency reference source for a frequency synthesizer, cost, short term stability and long term stability are important factors. Short term stability relates to the SBN and long term stability refers to the change in frequency over temperature, voltage, process, and time. Fixed frequency reference sources, such as crystal oscillators can have excellent short term stability and the long term stability can be improved using compensation, and are referred to as temperature compensated crystal oscillators (TCXO). Some of the more popular TCXOs operate in the range of 15-40 MHz. However, using frequency references in this range for synthesizing frequencies in the 800 MHz to 1 GHz range requires a loop divide number sufficiently high so as to necessitate a low pass loop filter design yielding a closed loop bandwidth on the order of 1.5 KHz to meet desired SBN levels for two-way radio applications. For typical voice channels having a bandwidth on the order of 3 KHz, a closed loop bandwidth of 1.5 KHz prevents sufficient frequency modulation when the modulation is applied to the loop at a single port. In lower bands, such as the VHF band (30 MHz to 300 MHz), creating a frequency modulated (FM) carrier is difficult to accomplish even with a reference frequency at 15 MHz. The loop divide numbers associated with this band would range from 2 to 20 with a 15 MHz reference. It has been established that 20 is the lowest average loop divide number needed to have the phase frequency detector operate in the linear region compatible with a $3^{rd}$ order FRAC-N synthesizer. Current solutions would be to use a frequency divider after the fixed frequency reference source before the signal is applied to the phase detector or use a frequency divider on the output signal of the PLL to obtain a lower frequency at the output of the divider.

The limiting aspects of using a TCXO in the range of 15-40 MHz requiring a closed loop bandwidth on the order of 1.5 KHz to 4 KHz has resulted in the use of a two port frequency modulation scheme that has been in use for years for constant envelope applications like frequency modulation, phase modulation, and complex modulation such as quadrature phase shift keying modulation. In a conventional two port modulator the low frequency modulation is performed digitally, using FRAC-N techniques, while the higher frequency component of the modulation signal is applied to the VCO via an analog path where some of the digital information is used to generate an analog signal that is added to the control input of the VCO. Thus, as information to be transmitted comes into the modulator, it is processed and split between the digital low frequency port and the analog high frequency port. The two port modulation approach requires careful tuning of amplitude and delay in each port path to ensure that the high frequency and low frequency modulation components are applied to the VCO control input to achieve the desired response over the modulation bandwidth.

Two port modulators, by nature of their design, are very sensitive to component value variations. Because of variations in component values, each modulator must be characterized upon manufacture to adjust signal levels, timing and other aspects of the modulator. Performing the characterization is time consuming and generally considered a gating operation in manufacturing. If the loop noise could be substantially reduced, then the closed loop bandwidth could be widened sufficiently to use just the digital low frequency port, all digital modulation, which would be a substantial advantage over two port modulators.

Accordingly, there is a need for a method and apparatus for low noise single port frequency modulation using a FRAC-N modulator.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

The problems associated with the prior art are solved by embodiments that include a single port frequency modulator. The single port modulator can be used to generate a modulated radio frequency signal, as well as general frequency synthesis for radio operation. The single port modulator includes a reference oscillator that produces a reference signal. The reference signal is provided to a phase detector that compares the reference signal to a modulation signal to produce a control signal. The control signal is filtered by a loop filter and provides the filtered control signal to the control input of a voltage controlled oscillator that produces an intermediate signal having a frequency dependent on the control signal. The intermediate signal from the voltage controlled oscillator is provided to an integer loop that multiplies the frequency of the intermediate signal at the voltage controlled oscillator to produce a multiplied intermediate signal. The frequency of the multiplied intermediate signal is higher than the frequency of the intermediate signal from the voltage controlled oscillator. An output divider divides the multiplied intermediate signal to produce an output having a desired output frequency, and a multi-modulus feedback divider divides the multiplied intermediate signal by a sequence of divider input numbers to produce the modulation signal that is provided to the phase detector. The single port modulator further includes a fractional-N modulator that provides the sequence of divider input numbers to the multi-modulus feedback divider block responsive to an integer input, a fractional input, and a modulation input.

Figure 1:
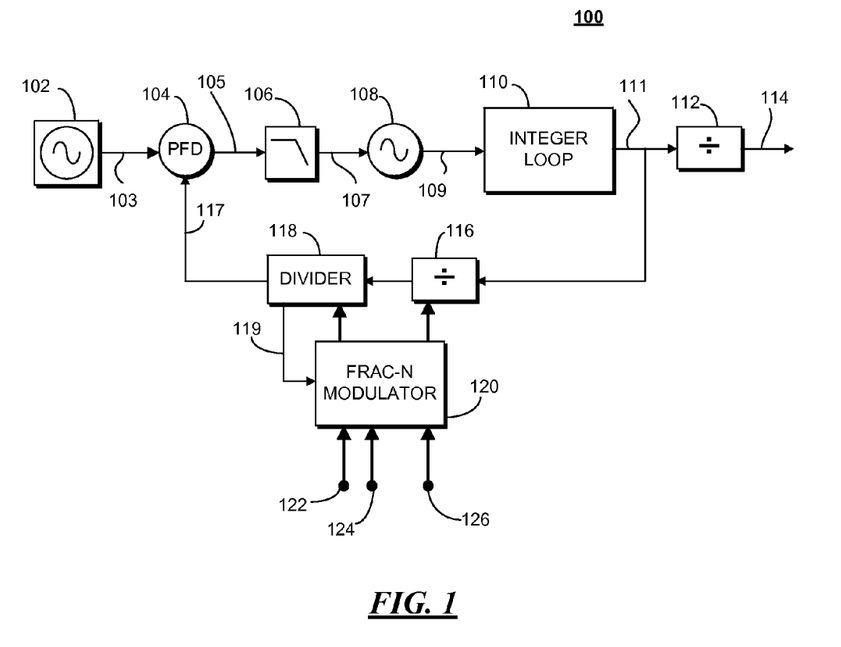
FIG. 1 is a block diagram of a single port FRAC-N modulator in accordance with some embodiments.

FIG. 1 is a block diagram of a single port FRAC-N modulator 100 in accordance with some embodiments. The modulator 100 can be used to modulate the frequency of the desired output signal, and also for stable frequency synthesis (e.g. no modulation) for use in other radio operations, such as in receiving radio signals. The modulator 100 includes a frequency reference, such as a frequency reference oscillator 102 that provides a reference signal 103. The frequency reference oscillator 102 can be a free running oscillator that is not controlled or adjusted during operation, such as, for example, a crystal oscillator. In some embodiments where a voice signal is being transmitted with a 3 KHz modulation bandwidth, the reference frequency can be at substantially 100 MHz.

The reference signal 103 is provided to a phase detector or phase frequency detector 104 that compares the phase of the reference signal 103 to the phase of a modulation feedback signal 117. The phase detector 104 generates a control signal 105 based on the comparison of the phases of the reference signal 103 and the modulation feedback 117. The control signal 105 is filtered by a loop filter 106 which allows a closed loop bandwidth that is greater than the modulation bandwidth, and which produces a filtered control signal 107. For example, the loop filter can allow a closed loop bandwidth of 10 KHz. The filtered control signal 107 is provided to a voltage controlled oscillator (VCO) 108 that generates an intermediate signal 109 having a frequency that is dependent on the voltage level of the filtered control signal 107. Accordingly, the intermediate signal 109 of the VCO 108 is a periodic signal at a frequency that can be controlled by the modulation feedback signal 117, and is, in some embodiments, higher in frequency than the transmission frequency (e.g. the signal being transmitted from the radio), and can be in the range of 8 to 12 times the frequency of reference signal 103.

The intermediate signal 109 of the VCO 108 is provided to an integer loop 110 that multiplies the frequency of the output of VCO 108, intermediate signal 109, to produce a multiplied intermediate signal 111 that is at a higher frequency than VCO intermediate signal 109. The integer loop 110 can multiply the VCO intermediate signal 109 by a multiplication factor of a small integer or an integer plus a half, that can be in the range of 1.5 to 4 in some embodiments, or higher in some embodiments, as much as or equal to 10. An integer plus a half multiplication factor is achieved by using, in the integer loop 110, a divider in a feedback path of a phase locked loop in the integer loop 110 that can toggle on both rising and falling edges of a divider input signal. The multiplied intermediate signal 111 is provided to an output divider 112 that divides the frequency of the multiplied intermediate signal 111 to produce the desired output signal 114 with the desired frequency. The output divider 112 can have a selectable or programmable divide factor that can be a small integer (e.g. 2, 3, 4, 6 . . . ). The output signal 114 will vary with modulation (when modulation is applied to the system). The reference frequency, the frequency of reference signal 103, can be greater than $\frac{1}{20}^{th}$ of the frequency of desired output signal 114.

The multiplied intermediate signal 111 is also fed back to a multi-modulus feedback divider block that can include a prescaler 116 and programmable divider 118. The prescaler 116 and programmable divider 118 divide down the frequency of the multiplied intermediate signal 111 by a divide number under the control of fractional-N (FRAC-N) modulator 120 which provides dynamically changing divide numbers to the prescaler 116 and programmable divider 118. In some embodiments the FRAC-N modulator 120 can set the prescaler 116 to a fixed number while dynamically varying a divide number provided to the programmable divider 118 to produce the desired modulation.

The FRAC-N modulator 120 has an integer input 122, a fractional input 124, and a modulation input 126. The integer input 122 and fractional input 124 can be used, for example, to select a carrier frequency, or (for non-modulation radio operations) synthesize a fixed frequency, while the modulation input 126 will vary in correspondence with the signal being transmitted (as modulation of the carrier frequency). The modulation input is derived from a baseband signal that is derived from a signal to be transmitted, such as a voice signal or digital data, and the modulation input 126 is used to vary (with time) the divide number provided by the FRAC-N modulator 120 to the multi-modulus feedback divider block 116, 118 to produce the modulation. The programmable divider 118 can also provide a clock signal 119 to the FRAC-N modulator to control the sequencing of the divide numbers going to the multi-modulus feedback divider block 116, 118. The modulator 100 is a single port modulator since modulation is only input into the loop in one location, which is the divide number provided by the FRAC-N modulator 120 based on the modulation input 126.

The high frequency reference oscillator 102 is selected to provide a reference signal 103 having a frequency that is significantly higher than is conventionally used in, for example, two way radio communications, in order to achieve the necessary loop bandwidth for single port modulation. A conventional reference frequency is 16.8 MHz (or sub-multiples such as 8.4 MHz, 5.6 MHz, 4.2 MHz or 2.1 MHz), as produced by a popular temperature compensated crystal oscillator. Using, for example, a 100 MHz reference frequency, the expected fractional-N quantization noise advantage over a 16.8 MHz reference frequency in a synthesizer having three accumulators is on the order of 38.7 dB and the noise that scales with $20 \, \text{Log}(F_{out}/F_{ref})$ has a noise advantage of 15.5 dB or more depending on the divide value of the output divider 112. The improvement in noise allows for a wider closed loop bandwidth achieved by adjustments to the loop filter 106 such that the closed loop response is wide enough to accommodate the modulation bandwidth, thereby obviating the need for a two port modulation scheme.

Figure 2:
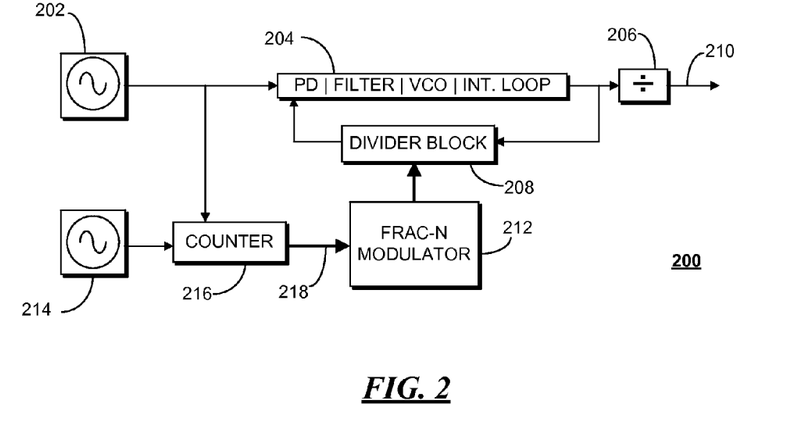
FIG. 2 is a block diagram of a frequency correction circuit for a single port FRAC-N modulator in accordance with some embodiments.

FIG. 2 is a block diagram of a frequency correction circuit for a single port FRAC-N modulator 200 in accordance with some embodiments. The modulator 200 follows the architecture of that shown in FIG. 1, and includes a high frequency reference oscillator 202, a PLL forward lineup 204 that includes a phase detector, loop filter, voltage controlled oscillator, and an integer loop which produces a multiplied intermediate signal. The modulator 200 also includes an output divider 206 the divides the output of the PLL forward path 204 (e.g. the output of the integer loop) for providing the output signal 210 that is a modulated carrier. The output of the PLL forward path 204 is fed back to a divider block 208, which divides the output of the PLL forward path 204 based on input from a FRAC-N modulator 212, which operates substantially the same as FRAC-N modulator 120 of FIG. 1.

The high frequency reference oscillator 202 can produce a reference frequency on the order of 100 MHz, and in some embodiments it can be substantially higher. However, while uncompensated, low noise oscillators, such as crystal oscillators, are available for a reasonable cost, temperature drift of the reference frequency would be unacceptable. Accordingly, the modulator 200 provides compensation by using a low frequency temperature compensated reference oscillator 214 such as a temperature compensated crystal oscillator. The low frequency reference oscillator 214 can operate at a frequency on the order of half or less that of the high frequency reference oscillator 202. For example, the low frequency reference oscillator 214 can be a 16.8 MHz temperature compensated reference oscillator. The low frequency reference oscillator provides a compensated reference signal (timebase) to a counter 216. Likewise the output of the high frequency reference oscillator is also provided to the counter 216. The counter 216 determines an error between the compensated reference signal provided by the low frequency reference oscillator 214 and the reference signal provided by the high frequency reference oscillator 202 and provides a compensation signal 218 to the FRAC-N modulator 212. The compensation signal is used to offset the carrier selection number provided to the feedback divider 208, where the offset compensates for temperature drift of the high frequency oscillator 202.

Figure 3:
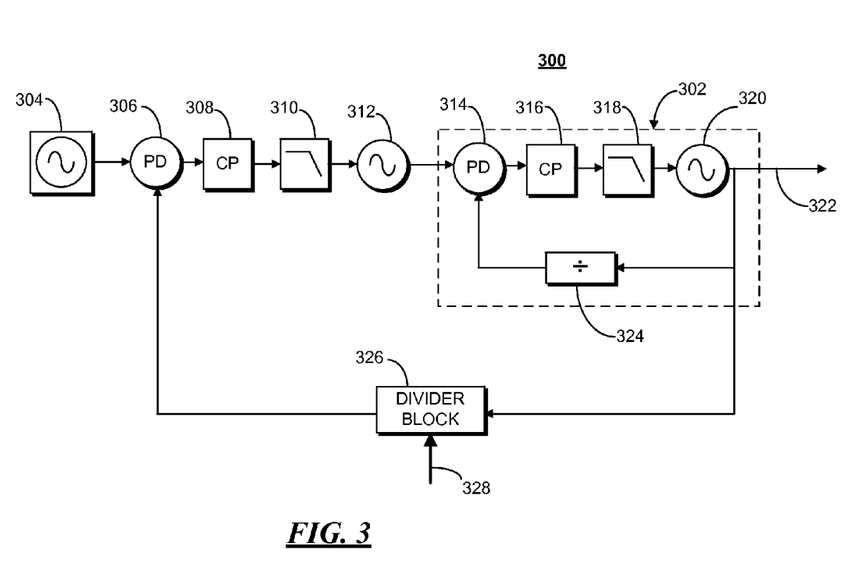
FIG. 3 is a block diagram of a single port FRAC-N modulator using an embedded integer PLL in accordance with some embodiments.

FIG. 3 is a block diagram of a single port FRAC-N modulator 300 using an embedded integer loop 302 in accordance with some embodiments. The embedded integer loop 302 operates as the integer loop 110 of FIG. 1, for example. The modulator 300 includes a high frequency reference oscillator 304, phase detector 306, charge pump 308, loop filter 310, and VCO 312, which all operate substantially similar as their corresponding components in FIG. 1. The charge pump 308 is a functionality included in the phase detector block 104 of FIG. 1.

The embedded integer loop 302 includes a phase detector 314 that compares the intermediate signal produced by VCO 312 to the feedback signal from a feedback divider 324 and provides an output to a charge pump 316 to produce a control signal that is filtered by a loop filter 318 to provide a filtered control signal to the integer loop VCO 320, which produces the multiplied intermediate signal 322 (which is fed to an output divider such as output divider 112 of FIG. 1). Accordingly, the frequency of multiplied intermediate signal 322 will be higher than the frequency of the intermediate signal of VCO 312 by the divide factor of feedback divider 324 which can be set to different divide factors that can be low integers or integers plus a half (e.g. 2.5, 3, 3.5). The multiplied intermediate signal 322 is also fed back to a multi-modulus feedback divider block 326 which divides the multiplied intermediate signal 322 by a divide number 328.

Figure 4:
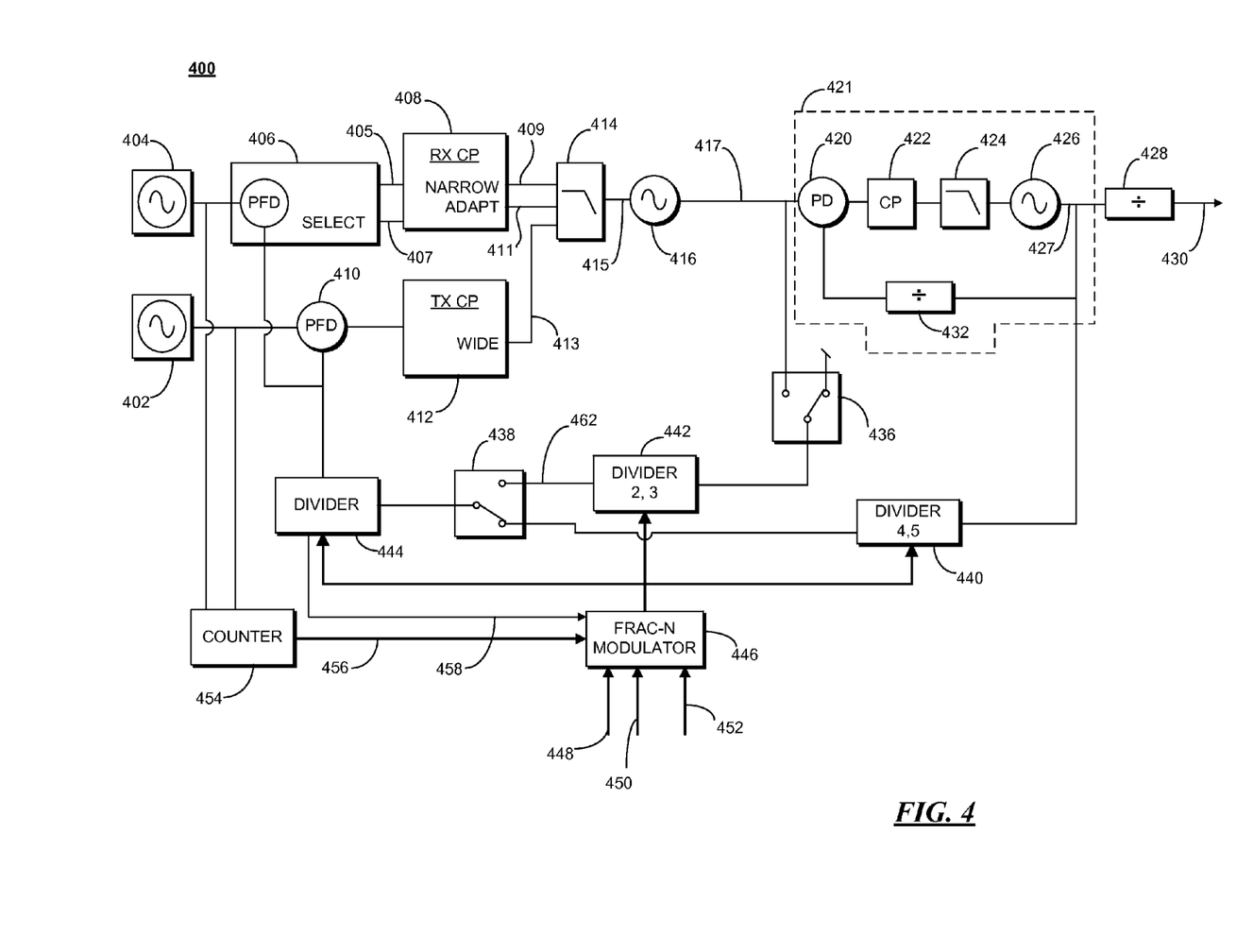
FIG. 4 is a block diagram of a reconfigurable single port FRAC-N modulator in accordance with some embodiments.

FIG. 4 is a block diagram of a reconfigurable single port FRAC-N modulator 400 in accordance with some embodiments. The modulator 400 is reconfigurable to provide an unmodulated carrier for use in other radio operations, such as receiving a signal. The modulator 400 includes a high frequency reference oscillator 402 and a low frequency reference oscillator 404. The high frequency reference oscillator 402 can be an uncompensated crystal oscillator while the low frequency reference oscillator 404 can be a temperature compensated crystal oscillator. Since, in receive mode, there is no modulation, the closed loop frequency response of the PLL is not a gating concern. Accordingly the low frequency reference oscillator 404 can be used for frequency synthesis in receiving and demodulating signals. The low frequency reference oscillator 404 provides a low frequency (relative to the high frequency reference 402) reference signal to a receive phase detector 406 that compares the low frequency reference signal with the divider output of divider 444. The receive phase detector 406 provides a control signal 405 to a receive charge pump 408 which alternatively produces control signals 409, 411 based on select signal 407. The receive charge pump can indicate, via a select signal 407, which of two modes to use, either a narrowband mode or an adaptive mode. In the narrowband mode the receive charge pump provides a narrowband control signal 409, and in the adaptive mode the receive charge pump 408 provides an adaptive control signal 411. The narrowband and adaptive control signals are provided to a loop filter 414.

Similarly, for transmit operation, which uses modulation, the high frequency reference oscillator 402 provides a high frequency reference signal to a transmit phase detector 410 that compares the high frequency reference signal to the output of the divider 444 and produces an output based on the comparison. The output of the transmit phase detector 410 is used by a transmit charge pump 412 to produce a transmit control signal 413 that is provided to the loop filter 414. The loop filter 414 can be configurable to change the frequency response of the loop filter 414, based on the mode of operation. For example, in the transmit mode, the frequency response of the loop filter can be set to accommodate the modulation bandwidth, while in receive mode the closed loop bandwidth of the PLL can be substantially reduced while the sideband noise performance continues to meet the requirements. The loop filter 414 provides a filtered control signal 415 to a voltage controlled oscillator 416 which produces an intermediate signal 417 with a frequency corresponding to a voltage level of the filtered control signal 415.

In a transmit mode the intermediate signal 417 is provided to integer loop 421 which includes an embedded integer PLL, including a multiplier phase detector 420, multiplier charge pump 422, multiplier loop filter 424, a multiplier voltage controlled oscillator 426, and an integer loop divider 432 to provide PLL operation to multiply the frequency of the intermediate signal 417 up by the divide factor of integer loop divider 432, which can be set and fixed to one of a selection of different divide factors that are integers or integers plus one half, as appropriate. In some embodiments the divide factor of integer loop divider 432 can be an integer or integer plus a half that is less than or equal to 10. The frequency of multiplied intermediate signal 427 of the integer loop 421 can be divided by an output divider 428 to produce the desired output signal 430 with the desired transmit frequency. The multiplied intermediate signal 427 of the integer loop 421 is fed to transmit prescaler 440 that divides the frequency of multiplied intermediate signal 427 of the integer loop 421 by a selected factor which can be, for example, on the order of 4 or 5. The transmit prescaler 440 is further coupled, through a divider switch 438, to the programmable divider 444 of the multi-modulus feedback divider block. A FRAC-N modulator 446 provides divide input to the programmable divider 444, transmit prescaler 440, as well as a receive prescaler 442. A receive switch 436 can be used to connect or disconnect the intermediate signal 417 to the receive prescaler 442. In the transmit mode, the receive switch 436 can be configured to disconnect the intermediate signal 417 from the receive prescaler 442. It will be appreciated by those skilled in the art that, in some embodiments, receive switch 436 can be removed, since divider switch 438 determines which signal is provided to the programmable divider 444. Furthermore, it will be appreciated by those skilled in the art that the receive switch 436 and divider switch 438 can be implemented in various forms. For example the switches 436, 438 can be implemented as a switching function that alternately enabled receive prescaler 442 or transmit prescaler 440 such that only one of them provides a signal to programmable divider 444. Accordingly, divider switch 438, although shown in a form representative of a physical switch, more generally represents a switching function that operates to provide the signal from the receive prescaler 442 to the programmable divider 444 during a receive mode of operation, and the output of the transmit prescaler 440 to the programmable divider 444 during a transmit mode of operation. The FRAC-N modulator 446 receives an integer input 448, fractional input 450, and a modulation input 452. Since, in the transmit mode, the high frequency reference oscillator 402 is used for frequency synthesis, and because, in some embodiments, it is an uncompensated oscillator, the low frequency reference oscillator 404 is used to compensate the loop via a counter 454 the compares the high frequency reference signal with the compensated low frequency reference signal to provide a compensation signal 456 to the FRAC-N modulator 446. The programmable divider 444 also provides a clock signal 458 to the FRAC-N modulator 446.

In the receive mode, the transmit prescaler 440 is disabled and the receive prescaler 442 is enabled. The divider switch 438 is shown in the state in which it would be for the transmit mode, and would be switched from the position shown here when in the receive mode. The FRAC-N modulator 446, integer loop divider 432, and output divider 428 can be programmed to a setting for the receive prescaler 442 and programmable divider 444 so that the desired frequency is generated at the desired output signal 430, which can be used for non-modulated radio operations, such as for demodulating a received signal. Accordingly, in the receive mode, the high frequency reference oscillator 402 and counter 454 can be disabled, along with transmit phase detector 412 and transmit charge pump 412, which operates at a higher frequency than receive phase detector 406 and the receive charge pump 408, thus reducing power consumption in the receive mode compared to the transmit mode. The frequency selection can be made, in the receive mode, by setting receive prescaler 442 and programmable divider 444 to appropriate divide factor to achieve the desired frequency at the desired output signal 430.

The reconfigurable single port FRAC-N modulator 400 allows a reduction in power consumption in a receive mode or when a modulated carrier is not needed. Power consumption can be reduced by using circuits in the PLL that are functionally equivalent but operate with inputs at a lower frequency and disabling circuits that are intended to enable single port modulation. Therefore in receive mode the following blocks are disabled: the high frequency oscillator 402 (100 MHz), transmit phase detector 410 (100 MHz), transmit charge pump 412 (100 MHz, BW=10 KHz), high frequency prescaler 440 (2 GHz to 4 GHz), and counter 454. Furthermore, in receive mode, the following blocks are enabled: the receive phase detector 406 (16.8 MHz), the receive charge pump 408 (16.8 MHz, BW=1.5 KHz), and the receive prescaler 442 (0.8 to 1.2 GHz). Additionally, other blocks are retained but operate at a lower input frequency in receive mode, including the divider 444 (reduced from a maximum 1.2 GHz to a maximum of 600 MHz), and the FRAC-N modulator 446 (reduced from a maximum 1.2 GHz to a maximum of 600 MHz). The operation of embedded integer loop 421 and the output divider 428 remain the same in both receive mode and transmit mode.

Figure 5:
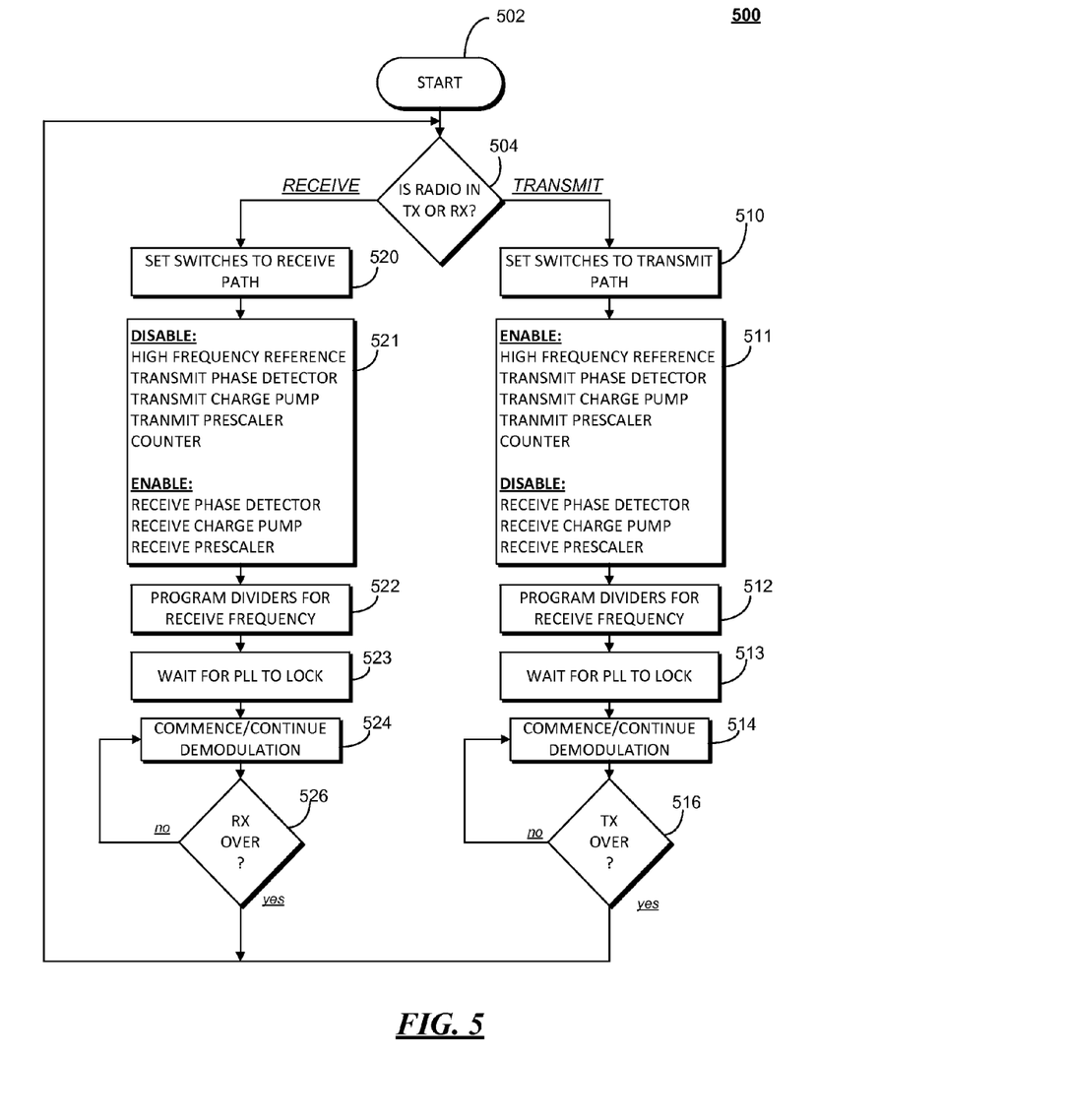
FIG. 5 is a flow chart of a method of operating a reconfigurable single port FRAC-N modulator in accordance with some embodiments.

FIG. 5 is a flow chart of a method 500 of operating a reconfigurable single port FRAC-N modulator in accordance with some embodiments. The modulator is reconfigurable between a transmit mode and a receive (or other non-modulating) mode. Although, conventionally, the term "receive" in some fields of radio systems refers to receiving and outputting a modulated signal in some form (e.g. audio, video, data, etc.), as an alternative to a "standby" mode where the radio is not outputting information or user perceptible signals that are being received. However, even in a standby mode, a radio is typically "receiving" in that it is tuned to a channel (or channels) and waiting for a modulated signal to appear on the channel. Accordingly, even in "standby" mode the radio requires frequency synthesis in order to detect the presence of modulated signals in one or more monitored channels, and as used in the present disclosure, the term "receive" simply refers to any operation where frequency synthesis is performed, but modulation is not applied or used.

The flow chart shows a series of boxes, each of which are abstractions of processes and sub-processes that are performed by a radio system that includes a modulator, and more generally, a frequency synthesis circuit for transmitting and receiving radio frequency signals. The processes can be carried out in numerous ways using a variety of circuit and component arrangements that will occur to those skilled in the art in view of the teachings herein. In some embodiments the method 500 can be carried out by circuitry such as that shown in FIG. 4 where, in a receive mode, the components necessary for single port modulation are not necessary, and can be shut off to reduce power consumption. Accordingly, switches are used to reconfigure the circuitry and signal paths differently for receive and transmit modes. In the receive mode, the switches are configured for simple frequency synthesis and power savings, and while in the transmit mode the switches are configured for single port modulation.

At the start 502, the modulator, radio, and other circuitry and components necessary for the method are powered and able to perform the necessary processes. In order to determine how to configure the modulator (for modulation or only frequency synthesis), the mode must be determined, as in process 504. In some embodiments the receive mode can be a default mode where the modulator performs simple frequency synthesis to generate a carrier tone at a desired frequency for receiving and monitoring a selected channel or channels.

A transmit mode can be commenced, for example, upon a user action, such as pressing a push to talk button. Upon commencing the transmit mode, the reconfigurable modulator can set various switches to include circuitry necessary for single port modulation, as in process 510. One switch includes the path to the transmit prescaler. Various circuits that support single port modulation are enabled and other circuits used only in receive mode are disabled as in process 511. The appropriate divider values are programmed to select the desired carrier frequency in the transmit mode as in process 512. The status of the PLL is monitored to determine when the PLL has reach steady state and is locked to the desired frequency as in process 513. Modulation can then commence, as in process 514, by varying the divide number at a programmable divider in accordance with a signal transmitted by modulating the carrier. The modulation continues as long as the transmit mode continues, as indicated by process 514. When the transmit mode ends, the method can then return to receive mode.

In the receive mode, from process 504, the switch is set to connect the receive prescaler path, as indicated in process 520. Various circuits that support the receive mode are enabled and other circuits used only in transmit mode are disabled as in process 521. The appropriate divider values are programmed to select the desired carrier frequency in the receive mode as in process 522. The status of the PLL is monitored to determine when the PLL has reach steady state and is locked to the desired frequency as in process 523. Once the circuits are configured for receiving, the receive mode commences as indicated in process 524. The receive mode can include both a monitoring mode and an active receive mode where a signal in a monitored channel is demodulated to obtain information that can be rendered in a perceptible way to a user of the radio system using the modulator. The receive mode can continue, as in process 526, until a transmit event or some other even occurs.

Among the benefits provided by the various embodiments taught herein is that a single port modulator can be realized, eliminating a substantial number of components required for two port modulation as in the prior art. Furthermore, the lack of those components associated with a conventional two port modulator thereby obviates the need for tuning and adjusting those components. Furthermore, while the single port modulator described here is useful for constant envelope modulation, the wider PLL loop bandwidth achieved using the higher timebase will allow faster lock times, lower SBN and continuous frequency coverage from, for example, 100 MHz to 1 GHz when using a quadrature mixer or using a non-constant envelope modulation.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A single port frequency modulator, comprising:
a reference oscillator that produces a reference signal at a reference frequency;
a phase detector that compares the reference signal to a modulation signal to produce a control signal;
a loop filter that filters the control signal to produce a filtered control signal;
a voltage controlled oscillator that produces an intermediate signal having a frequency dependent on the filtered control signal;
an integer loop that multiplies the frequency of the intermediate signal to produce a multiplied intermediate signal, wherein the frequency of the multiplied intermediate signal is higher than the frequency of the intermediate signal by a multiplication factor which is an integer or an integer plus one half;
an output divider that divides the frequency of the multiplied intermediate signal to produce a desired output signal at a desired output frequency;
a multi-modulus feedback divider block that divides the frequency of the multiplied intermediate signal by a sequence of divider input numbers to produce the modulation signal that is provided to the phase detector; and
a fractional-N modulator that provides the sequence of divider input numbers to the multi-modulus feedback divider block responsive to an integer input, a fractional input, and a modulation input provided to the fractional-N modulator;
wherein single port modulator is comprised in a radio device having a receive mode and a transmit mode, the feedback divider block includes programmable divider that produces the modulation signal, the single port modulator further comprising a divider switch that selectively provides the intermediate signal, through a receive prescaler, to the programmable divider in a receive mode, and the multiplied intermediate signal, through a transmit prescaler, to the programmable divider in a transmit mode, wherein a power consumption reduction is achieved in the receive mode.

2. The single port modulator of claim 1, wherein the reference frequency is greater than $1/20^{th}$ of the desired output frequency, and the phase detector is operated in a linear region by virtue of the multi-modulus feedback divider block dividing the frequency of the multiplied intermediate signal.

3. The single port modulator of claim 1, wherein the multiplication factor of the integer loop is an integer or integer plus a half that is less than or equal to 10.

4. The single port modulator of claim 1, wherein the integer loop comprises a phase locked loop including an integer loop phase detector that compares the intermediate signal from the voltage controlled oscillator to an integer loop divider feedback signal to produce an integer loop control signal, an integer loop filter that filters the integer loop control signal to produce a filtered integer loop control signal, an integer loop voltage controlled oscillator that generates the multiplied intermediate signal based on the filtered integer loop control signal, and an integer loop divider that divides the multiplied intermediate signal to produce the integer loop divider feedback signal.

5. The single port modulator of claim 1, wherein the PLL closed loop response has a bandwidth of substantially 10 KHz.

6. The single port modulator of claim 1, wherein the multi-modulus feedback divider block comprises a prescaler in series with a programmable divider, wherein the fractional-N modulator provides a divider modulation number to the multi-modulus divider, wherein the divider modulation number is based on the modulation input of the fractional-N modulator.

7. The single port modulator of claim 1, wherein the low frequency temperature stable reference frequency is less than half that of the reference frequency provided by the high frequency uncompensated crystal oscillator.

8. The single port modulator of claim 1, wherein the multi-modulus feedback divider block provides a clock signal to the fractional-N modulator.

9. A method for modulating a signal, comprising:
comparing a high reference frequency to a modulation signal at a phase detector to produce a control signal;
filtering the control signal through a loop filter to produce a filtered control signal;
applying the filtered control signal to a voltage controlled oscillator that generates an intermediate signal frequency in dependence upon a level of the filtered control signal;

multiplying the intermediate signal frequency of the voltage controlled oscillator to produce a multiplied intermediate signal frequency;

dividing the multiplied intermediate signal frequency by an output divider to produce a desired output frequency;

dividing the multiplied intermediate signal frequency by a multi-modulus feedback divider block to produce the modulation signal, wherein the multi-modulus feedback divider block divides the multiplied intermediate signal frequency by a sequence of divide numbers; and providing the sequence of divide numbers to the multi-modulus feedback divider block by a FRAC-N modulator, wherein the FRAC-N modulator varies the sequence of divide numbers in correspondence with a signal to be transmitted;

wherein the high reference frequency is provided by an uncompensated crystal oscillator, the method further comprises:

comparing the high reference frequency to a low reference frequency to produce a compensation signal;

providing the compensation signal to the FRAC-N modulator; and adjusting the divide numbers in dependence on the compensation signal.

10. The method of claim 9, wherein comparing the reference frequency to the modulation signal comprises comparing a reference frequency that is greater than ¹⁄₂₀th of the output desired frequency.

11. The method of claim 9, wherein multiplying the intermediate signal frequency of the voltage controlled oscillator comprises multiplying the intermediate signal frequency by an integer or integer plus a half that is less or equal to 10.

12. The method of claim 9, wherein multiplying the intermediate signal frequency of the voltage controlled oscillator is performed using an integer loop.

13. The method of claim 9, wherein the closed loop response of the PLL has a bandwidth that is greater than a modulation bandwidth of a voice signal.

14. A method for configuring a modulator phase locked loop, comprising:

in a transmit mode:

enabling a transmit phase detector and an integer loop, the transmit phase detector comparing a high reference frequency with a modulation signal to produce a control signal, filtering the control signal to produce a filtered control signal provided to a voltage controlled oscillator to produce an intermediate signal having a frequency that corresponds to a level of the filtered control signal;

multiplying the frequency of the intermediate signal to produce a multiplied intermediate signal that is frequency divided by an output divider to produce a desired output signal, the multiplied intermediate signal further frequency divided by a transmit prescaler that provides a prescaled signal to a programmable divider;

varying a divide number provided to the programmable divider in correspondence with a signal to be transmitted to produce the modulation signal; and in a receive mode:

disabling the high frequency reference, transmit phase detector, transmit charge pump, transmit prescaler, and counter;

enabling the receive phase detector, receive charge pump, and receive prescaler;

selecting the path from the receive prescaler to the programmable divider; and comparing the a low reference frequency with an output of the programmable divider that further divides an output of the receive prescaler, wherein the output of the programmable divider corresponds to a selected carrier frequency.

15. The method of claim 14, wherein the integer loop comprises an embedded integer phase locked loop that selectively multiplies the frequency of the intermediate signal of the voltage controlled oscillator by a factor of an integer or integer plus a half that is less than or equal to 10.

16. The method of claim 14, wherein the high reference frequency is provided by an uncompensated crystal oscillator, the low reference frequency is provided by a temperature compensated crystal oscillator, the method further comprises, in the transmit mode:

comparing the high reference frequency to the low reference frequency to produce a compensation signal; and adjusting the divide number in correspondence with the compensation signal.

17. The method of claim 14, wherein, in the transmit mode, the high reference frequency is greater than $\frac{1}{20}^{th}$ of the desired output frequency.

* * * * *